(12) United States Patent
Zhang et al.

(10) Patent No.: US 10,078,158 B2
(45) Date of Patent: Sep. 18, 2018

(54) MANUFACTURING DISPLAY PANELS WITH INTEGRATED MICRO LENS ARRAY

(71) Applicant: Hong Kong Beida Jade Bird Display Limited, Hong Kong (CN)

(72) Inventors: Lei Zhang, Albuquerque, NM (US); Fang Ou, Monterey Park, CA (US); Qiming Li, Albuquerque, NM (US)

(73) Assignee: Hong Kong Beida Jade Bird Display Limited, Hong Kong (CN)

( * ) Notice: Subject to any disclaimer, the term of this patent is extended or adjusted under 35 U.S.C. 154(b) by 87 days.

(21) Appl. No.: 15/272,410

(22) Filed: Sep. 21, 2016

(65) Prior Publication Data

US 2017/0242160 A1    Aug. 24, 2017

Related U.S. Application Data

(63) Continuation of application No. 15/269,956, filed on Sep. 19, 2016, now Pat. No. 9,977,152.

(60) Provisional application No. 62/299,511, filed on Feb. 24, 2016, provisional application No. 62/302,963, filed on Mar. 3, 2016.

(51) Int. Cl.
*G02B 3/00* (2006.01)
*G09G 3/20* (2006.01)
*G09G 3/34* (2006.01)

(52) U.S. Cl.
CPC ........ *G02B 3/0012* (2013.01); *G02B 3/0018* (2013.01); *G02B 3/0031* (2013.01); *G02B 3/0037* (2013.01); *G02B 3/0056* (2013.01); *G02B 3/0075* (2013.01); *G09G 3/2092* (2013.01); *G09G 3/3406* (2013.01); *G09G 3/346* (2013.01); *G09G 2320/028* (2013.01); *G09G 2320/0233* (2013.01); *G09G 2330/021* (2013.01)

(58) Field of Classification Search
CPC .................................................... G02B 3/0012
See application file for complete search history.

(56) References Cited

U.S. PATENT DOCUMENTS

| | | | |
|---|---|---|---|
| 5,715,022 A | 2/1998 | Takamatsu et al. | |
| 2001/0004251 A1* | 6/2001 | Kurematsu | G02F 1/133526 345/88 |
| 2004/0027675 A1 | 2/2004 | Wu et al. | |
| 2005/0061950 A1 | 3/2005 | Jiang et al. | |
| 2005/0180020 A1 | 8/2005 | Steenblik et al. | |
| 2008/0111983 A1* | 5/2008 | Singer | G03F 7/70066 355/69 |

(Continued)

OTHER PUBLICATIONS

PCT International Search Report and Written Opinion, PCT Application No. PCT/US16/67787, dated Mar. 14, 2017, 17 pages.

(Continued)

*Primary Examiner* — Anne Hines
(74) *Attorney, Agent, or Firm* — Fenwick & West LLP

(57) ABSTRACT

Various embodiments include a display panel with integrated micro lens array. The display panel typically includes an array of pixel light sources (e.g., LEDs) electrically coupled to corresponding pixel driver circuits (e.g., FETs). The array of micro lenses are aligned to the pixel light sources and positioned to reduce the divergence of light produced by the pixel light sources. The display panel may also include an integrated optical spacer to maintain the positioning between the micro lenses and pixel driver circuits.

20 Claims, 15 Drawing Sheets

(56) References Cited

U.S. PATENT DOCUMENTS

2012/0092747 A1    4/2012   Martin et al.
2013/0181195 A1    7/2013   Cho et al.
2013/0194165 A1    8/2013   Tanaka et al.
2013/0207964 A1    8/2013   Fleck et al.

OTHER PUBLICATIONS

United States Office Action, U.S. Appl. No. 15/269,956, dated Dec. 1, 2017, 14 pages.

* cited by examiner

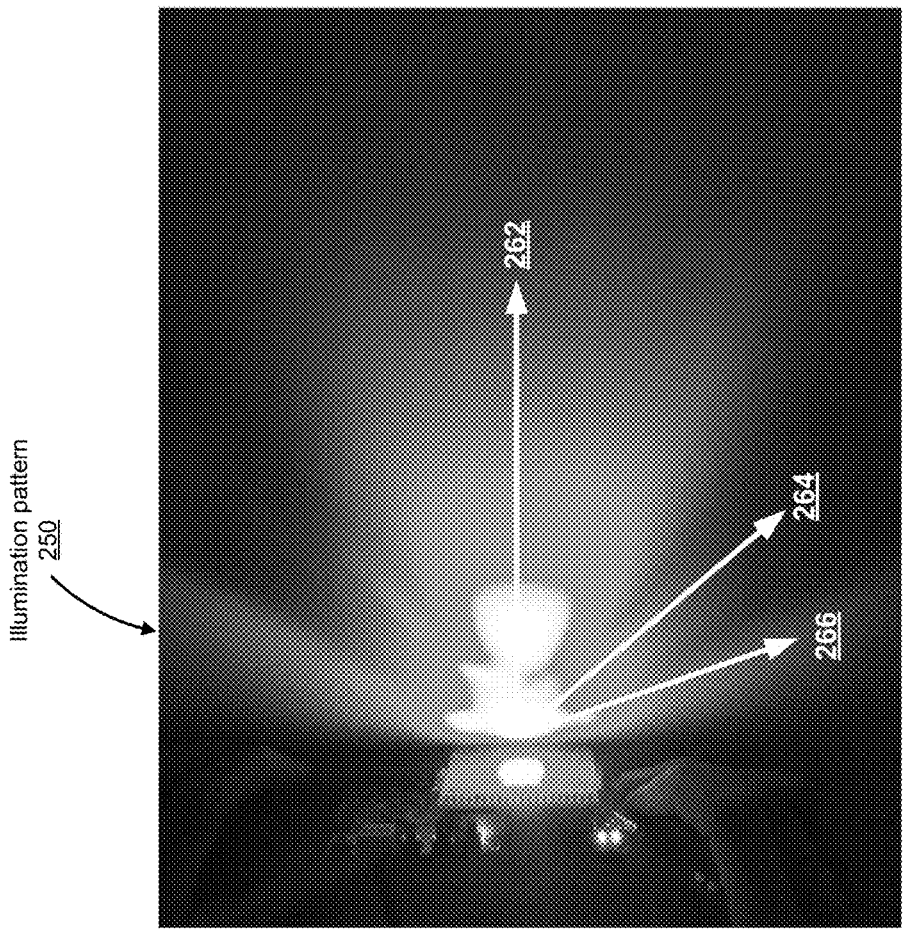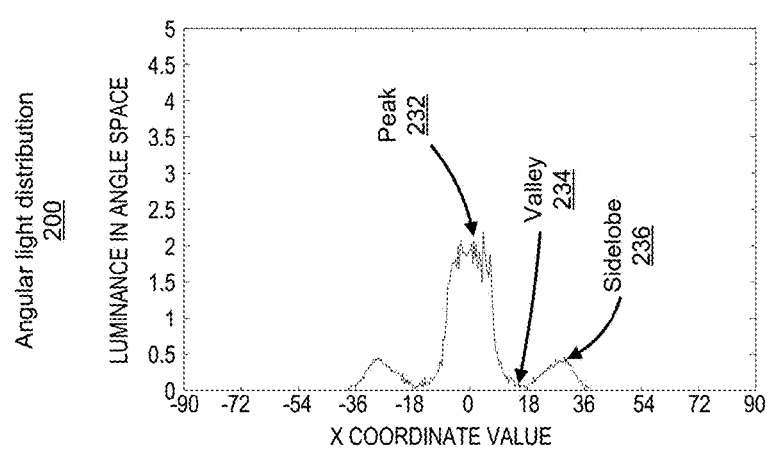
FIG. 2

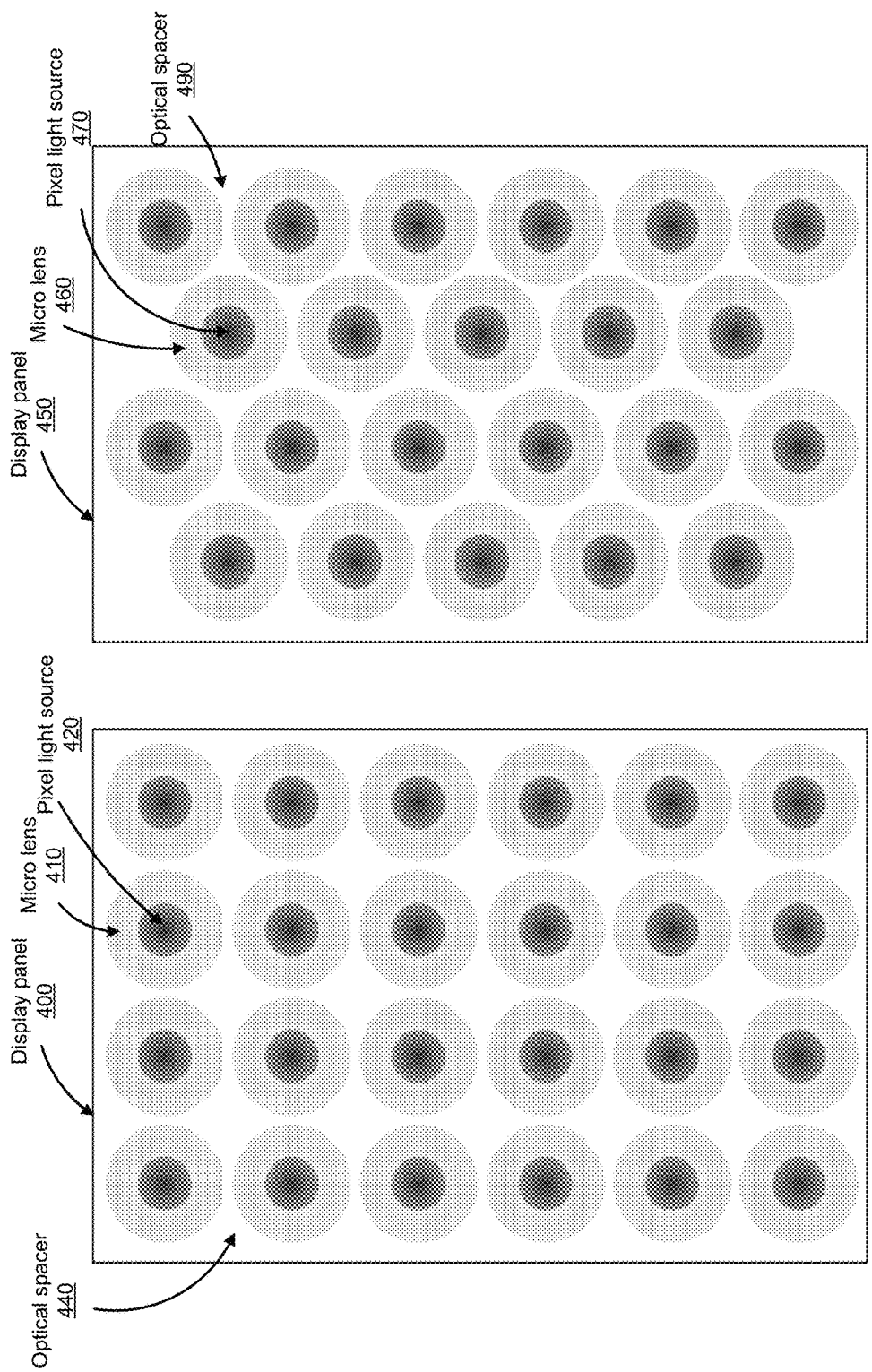

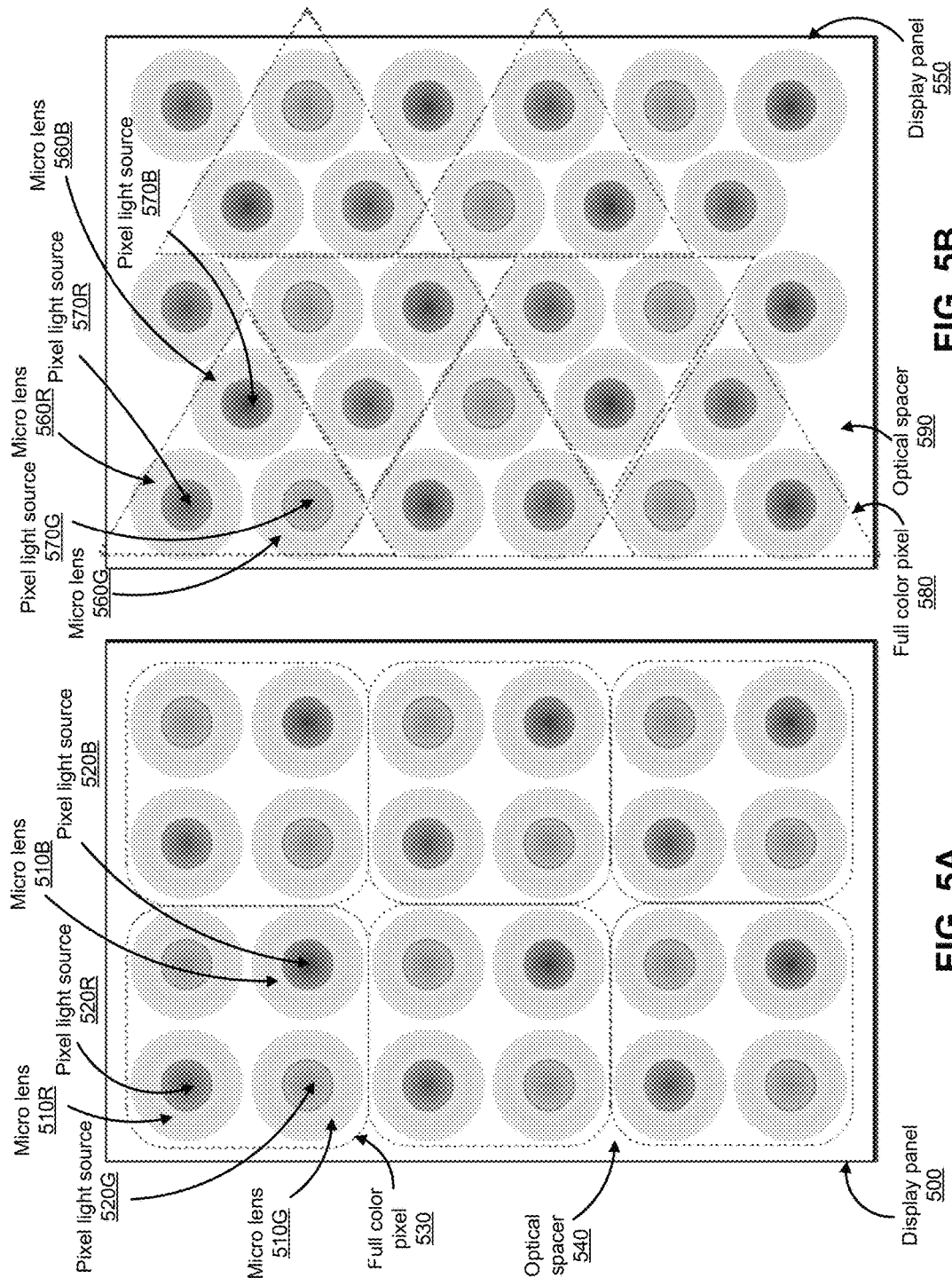

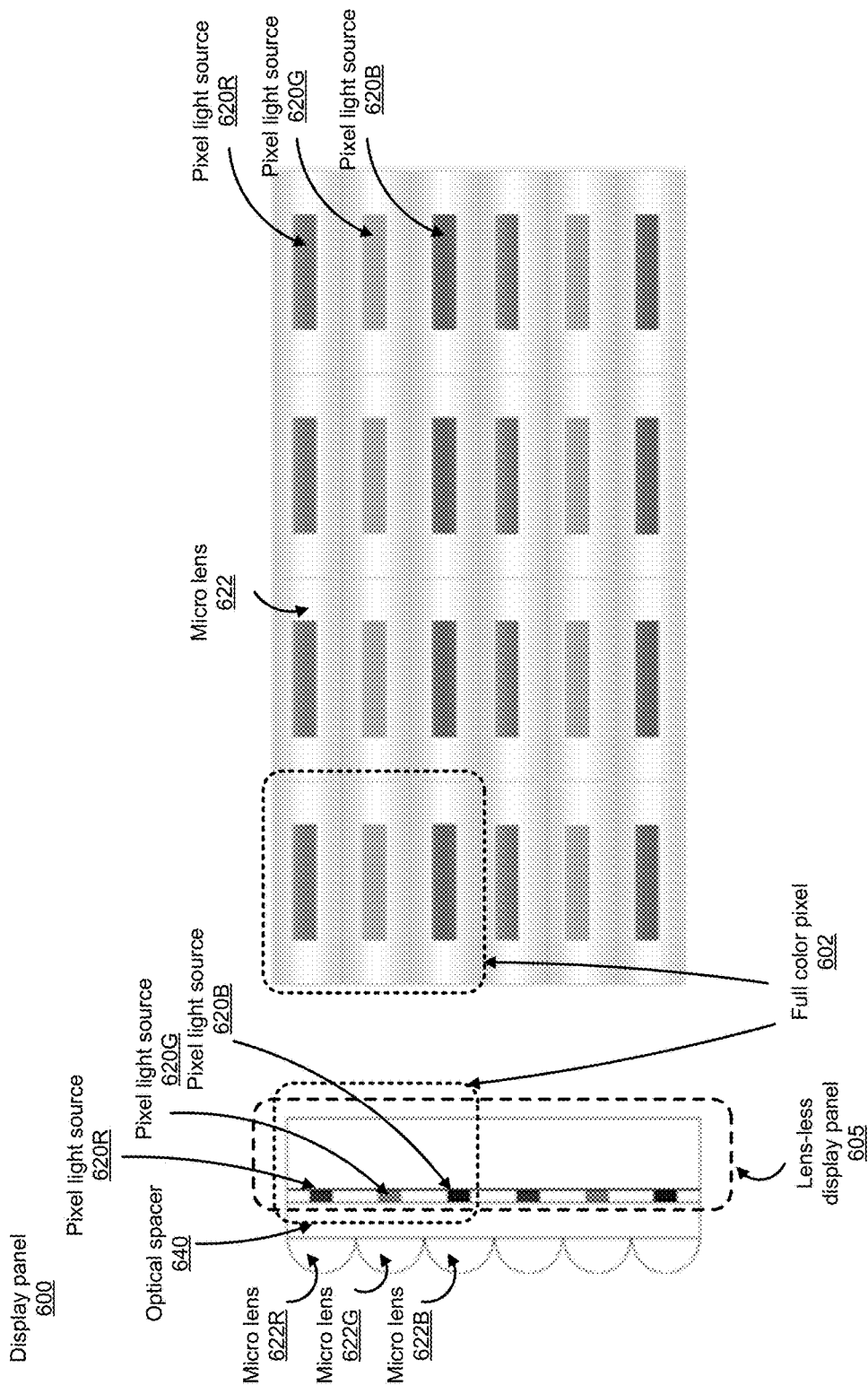

MANUFACTURING DISPLAY PANELS WITH INTEGRATED MICRO LENS ARRAY

CROSS-REFERENCE TO RELATED APPLICATION(S)

This application is a continuation of U.S. patent application Ser. No. 15/269,956, "Display panels with integrated micro lens array," filed Sep. 19, 2016; which claims priority under 35 U.S.C. § 119(e) to U.S. Provisional Patent Application Ser. No. 62/299,511, "Display panels with integrated micro lens array," filed Feb. 24, 2016 and to U.S. Provisional Patent Application Ser. No. 62/302,963, "Display panels with integrated micro lens array," filed March 3, 2016. The subject matter of all of the foregoing is incorporated herein by reference in their entirety.

BACKGROUND

1. Field of the Invention

This disclosure relates generally to display panels integrated with a micro lens array.

2. Description of Related Art

Display technologies are becoming increasingly popular in today's commercial electronic devices. These display panels are widely used in stationary large screens such as liquid crystal display televisions (LCD TVs) and organic light emitting diode televisions (OLED TVs) as well as portable electronic devices such as laptop personal computers, smartphones, tablets and wearable electronic devices. Much of development for the stationary large screens is directed to achieve a high viewing angle in order to accommodate and enable multiple audiences to see the screen from various angles. For example, various liquid crystal materials such as super wasted nematic (STN) and film compensated super twisted nematic (FSTN) have been developed to achieve a large viewing angle of each and every pixel light source in a display panel.

However, most of the portable electronic devices are designed mainly for single users, and screen orientation of these portable devices should be adjusted to be the best viewing angle for the corresponding users instead of a large viewing angle to accommodate multiple audiences. For example, a suitable viewing angle for a user may be perpendicular to the screen surface. In this case, compared with stationary large screens, light emitted at a large viewing angle is mostly wasted. Additionally, large viewing angles raise privacy concerns for portable electronic devices used in public areas.

As a result, there is a need for display panels with reduced viewing angle for reduced light waste and power consumption as well as better protection for user's privacy.

SUMMARY

Various embodiments include a display panel with integrated micro lens array. The display panel typically includes an array of pixel light sources (e.g., LEDs) electrically coupled to corresponding pixel driver circuits (e.g., FETs). The array of micro lenses are aligned to the pixel light sources and positioned to reduce the divergence of light produced by the pixel light sources. The display panel may also include an integrated optical spacer to maintain the positioning between the micro lenses and pixel driver circuits.

The micro lens array reduces the divergence angle of light produced by the pixel light sources and the useable viewing angle of the display panel. This, in turn, reduces power waste, increases brightness and/or better protects user privacy in public areas.

A display panel with integrated micro lens array can be fabricated using a variety of manufacturing methods, resulting in a variety of device designs. In one aspect, the micro lens array is fabricated on the substrate with the pixel light sources. High temperature reflow, grayscale mask photolithography, molding/imprinting/stamping, and dry etching pattern transfer are techniques that can be used to fabricate micro lens arrays. In another aspect, the micro lens array is formed separately from the substrate with the pixel light sources and then integrally attached to the substrate. Bonding and mechanical fixtures are two approaches for attaching the micro lens array.

Other aspects include components, devices, systems, improvements, methods and processes including manufacturing methods, applications, and other technologies related to any of the above.

BRIEF DESCRIPTION OF THE DRAWINGS

Embodiments of the disclosure have other advantages and features which will be more readily apparent from the following detailed description and the appended claims, when taken in conjunction with the accompanying drawings, in which:

FIG. 2 shows beam shaping effect of a micro lens array integrated in a display panel, according to one embodiment.

FIGS. 4A-4B are top views of example single-color display panels integrated with a spherical micro lens array, according to one embodiment.

FIGS. 5A-5B are top views of example multi-color display panels integrated with a spherical micro lens array, according to one embodiment.

FIGS. 6A-6B show a side view and top view, respectively, of a multi-color display panel integrated with a cylindrical micro lens array, according to one embodiment.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Figure 1A:
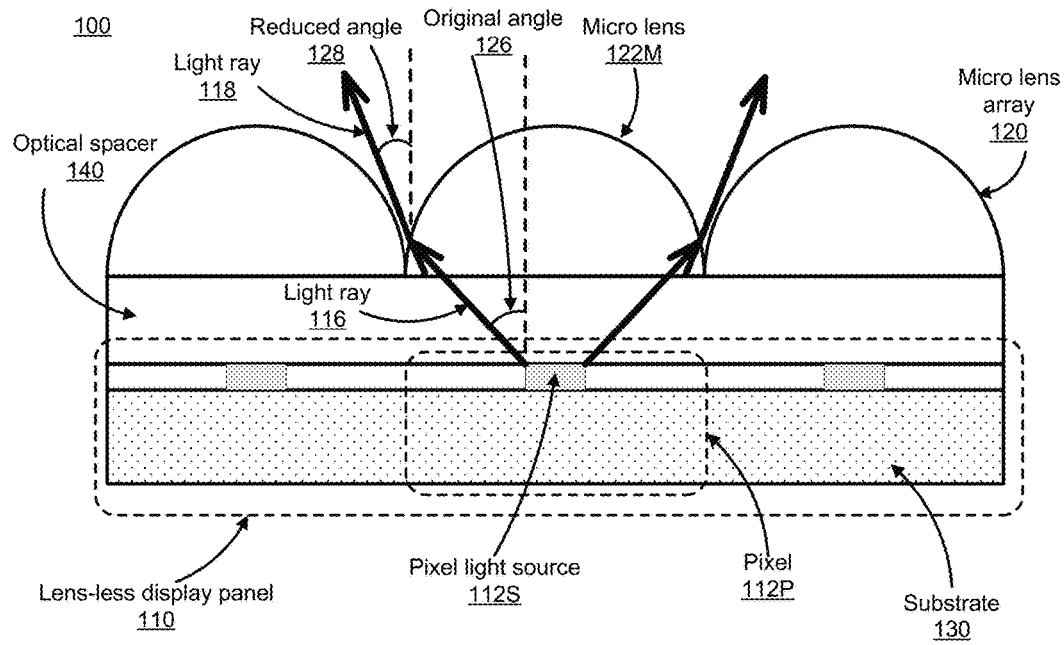
FIG. 1A is a cross-sectional view of an example display panel integrated with a micro lens array, according to one embodiment.

FIG. 1A is a cross-sectional view of an example display panel 100 integrated with a micro lens array 120, according to one embodiment. In FIG. 1A, the finished display panel 100 includes a lens-less display panel 110 (i.e., without a micro lens array), a micro lens array 120, and an optical spacer 140 formed between the lens-less display panel and the micro lens array. The display panel 100 typically includes an array of individual pixels 112P, each of which further includes a pixel driver circuit (not shown in FIG. 1A) and a corresponding pixel light source 112S that is electrically coupled to and driven by the pixel driver circuit. The pixel light sources 112S are individually controllable. The micro lens array 120 is formed above the lens-less display panel 110 with the micro lenses 122M aligned to corresponding pixel light sources 112S. For purposes of this disclosure, terms such as "above" and "top" means the direction of light propagating away from the pixel light source 112A and towards the viewer. The arrays of pixel light sources 112S, the array of pixel driver circuits (not shown) and the array of micro lenses are all integrated on a common substrate 130.

For clarity, FIG. 1A shows in the display panel 100 only three individual pixels 112P, each of which includes one pixel light source 112S that corresponds to one single micro lens 122M. It should be understood that a full display panel 100 will include an array of many individual pixels 112P and many micro lenses 122M. In addition, there does not have to be a one to one correspondence between micro lenses 122M and pixel light sources 112S, nor a one to one correspondence between the pixel driver circuits (not shown) and the pixel light sources. Pixel light sources could also be made of multiple individual light elements, for example LEDs connected in parallel.

The pixel light source 112S produces the light for the display panel 100. Different types of pixel light sources 112S can be used, for example, a micro LED array including an array of individual micro LEDs, a micro OLED array including an array of individual micro OLEDs, or a micro LCD array including an array of individual micro LCDs. Note that in the LCD array, the "pixel light source" actually modulates light produced from a backlight or elsewhere, as opposed to generating light from electricity, but will still be referred to as a pixel light source for convenience. In one embodiment, each individual pixel light source 112S includes a single light element. In another embodiment, each individual pixel light source 112S includes multiple light elements, for example LEDs coupled in parallel.

In FIG. 1A, the micro lens array 120 includes an array of individual micro lenses 122M, and each micro lens is aligned to a corresponding pixel light source 112S. The individual micro lenses 122M have positive optical power and are positioned to reduce the divergence or viewing angle for light that is emitted from the corresponding pixel light source 112S, as shown by light rays 116-118 in FIG. 1A. Light ray 116 represents the edge of the light beam emitted from the pixel light source 112S, which has an original divergence angle 126 that is fairly wide. The light is bent by the micro lens 122M, so that the new edge light ray 118 now has a reduced divergence angle 128. The micro lenses 122M in the micro lens array 120 are typically the same. Examples of micro lenses include spherical micro lenses, aspherical micro lenses, Fresnal micro lenses andcylindrical micro lenses.

The micro lens array 120 typically has a flat side and a curved side. In FIG. 1A, the bottom of the micro lens 122M is the flat side, and the top of the micro lens 122M is the curved side. Typical shapes of the base of each micro lens 122M include circle, square, rectangle, and hexagon. The individual micro lenses 122M may be the same or different: in shape, curvature, optical power, size, base, spacing, etc. In the example of FIG. 1A, the circular base of microlens 122M has a same width as the individual pixel 112P, but a smaller area since the microlens base is a circle and the individual pixel 112P is a square. The microlens base area is larger than the area of the pixel light source 112S.

The optical spacer 140 is an optically transparent layer that is formed to maintain the position of the micro lens array 120 relative to the pixel light source array 112S. The optical spacer 140 can be made from a variety of materials that are transparent at the wavelengths emitted from the pixel light sources 112. Example transparent materials for the optical spacer 140 include polymers, dielectrics and semiconductors. The optical spacer 140 can also be an air gap. The material for making the optical spacer 140 can be the same with or different from the material for making the micro lens array 120.

The thickness of the optical spacer is designed to maintain the proper spacing between the micro lens array 120 and the pixel light source array 112S. As one example, for an optical spacer that maintains an optical spacing between pixel light source and micro lens that is more than a focal length of the micro lens, an image of a single pixel is formed at a certain distance. As another example, for an optical spacer that maintains an optical spacing between pixel light source and micro lens that is less than a focal length of the micro lens, a reduced divergence/viewing angle is achieved. The amount of reduction of divergence/viewing angle also partly depends on the thickness of the optical spacer 140.

Figure 1B:
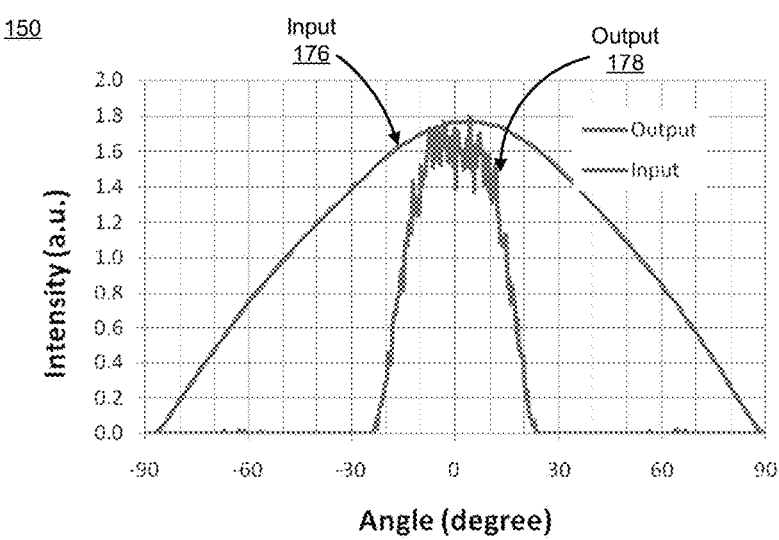
FIG. 1B shows the simulated angular light distribution from a single pixel of a display panel with a corresponding integrated micro lens, according to one embodiment.

FIG. 1B shows the simulated angular light distribution from a single pixel of a display panel with a corresponding integrated micro lens, according to one embodiment. The horizontal axis represents the angle of light propagation (0 degrees is on axis), and the vertical axis represents light intensity along that propagation direction. The input curve 176 represents the light emitted from the pixel light source but before passing through the micro lens (e.g., light ray 116 in FIG. 1A). The output curve 178 represents the same light but after passing through the micro lens (e.g., light ray 118 in FIG. 1B). As shown in FIG. 1B, the output 178 has a reduced divergence angle of 30 degrees (full width half max), compared to 110 degrees for the input 176. In addition, the forward luminance efficiency is maintained with only a slight optical loss. The values of the divergences angles and the amount of forward luminance reduction depends on the design of the micro lens array 120 and the optical spacer 140. In alternative embodiments, the initial divergence angle of the input 176 and the reduced divergence angle of the output 178, as well as the reduction between these two, may vary based on different designs of the micro lens array and the optical spacer of a display panel.

FIG. 2 shows beam shaping effect of a micro lens array integrated in a display panel, according to one embodiment. The left side of FIG. 2 is a chart 200 showing angular distribution of light,as simulated for a single pixel with corresponding micro lens (e.g., LED) of the display panel. The right side of FIG. 2 shows the illumination pattern 250, as produced by the entire array.

In chart 200 (which is rotated in FIG. 2), the horizontal axis represents the propagation angle (where x=0 is on-axis), and the vertical axis represents light intensity for light propagating at a specific angle. The angular light distribution shows a center peak 232, a first valley 234, and a first sidelobe 236. The illumination pattern 250 shows an actual measurement of light produced by a display panel. The directions 262, 264 and 266 correspond to the points 232, 234 and 236 shown in chart 200.

Figure 3B:
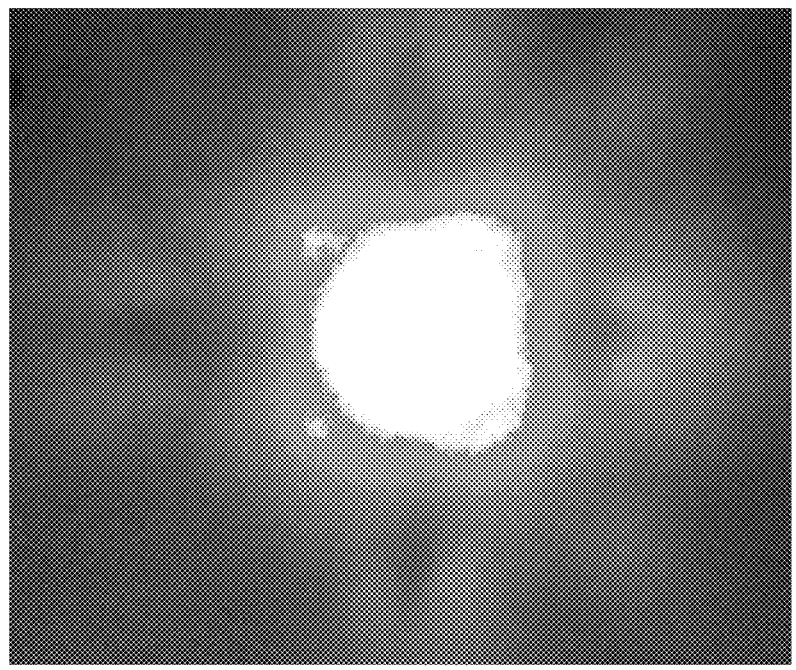
FIGS. 3A-3B show brightness enhancement effect of a micro lens array integrated in a display panel, according to one embodiment.
Figure 3A:
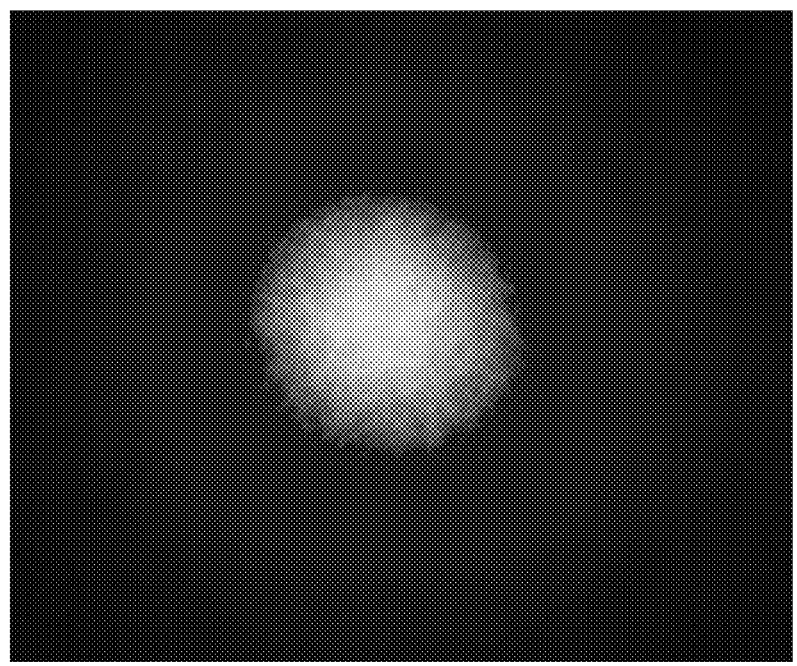

FIGS. 3A-3B show brightness enhancement effect of a micro lens array integrated in a display panel, according to one embodiment. More specifically, FIG. 3A shows brightness produced by a display panel without micro lenses, and FIG. 3B shows brightness produced by a display panel when integrated with micro lenses. As shown in FIGS. 3A-3B, a brightness enhancement effect is achieved via integrating a micro lens array onto the display panel. In this example, the brightness with the micro lens array is 4 times the brightness without the micro lens array in the direction perpendicular to the display surface, due to light concentrating effect of microlenses. In alternative embodiments, the brightness enhancement factor can vary according to different designs of the micro lens array and the optical spacer. For example, a factor greater than 8 can be achieved.

FIGS. 4A-4B are top views of example single-color display panels integrated with a spherical micro lens array, according to one embodiment. More specifically, FIG. 4A is a top view of an example single-color display panel 400 with a square array arrangement of the pixels, and FIG. 4B is a top view of an example single-color display panel 450 with a triangular or hexagonal array arrangement of the pixels. Both display panels 400, 450 include an array of micro lenses 410, 460, an array of pixel light sources 420, 470 below the micro lenses 410, and an optical spacer 440, 490 formed between the micro lens array and the pixel light source array. Each individual micro lens is aligned to a corresponding pixel light source. In more detail, the display panel 400 with the square matrix arrangement includes an array of individual micro lenses 410, a corresponding array of pixel light sources 420 and an optical spacer 440 in between, and the display panel 450 with the triangular matrix arrangement includes an array of individual micro lenses 460, a corresponding array of pixel light sources 470, and an optical spacer 490 in between. In both display panels 400, 450, the pixel light sources are single-color pixel light sources which all produce the same color light, for example, single color LEDs, which forms single-color display panels.

In FIGS. 4A-4B, the individual micro lenses 410, 460 of the corresponding display panel 400, 450 are spherical micro lenses arranged in a square or triangular matrix. In alternate embodiments, the micro lenses can have non-spherical shapes. The micro lenses can also be arranged in other matrix arrangements, such as a rectangular matrix arrangement or a hexagonal matrix arrangement.

FIGS. 5A-5B are top views of example multi-color display panels integrated with a spherical micro lens array, according to one embodiment. More specifically, FIG. 5A is a top view of an example multi-color display panel 500 with a square array arrangement of pixels, and FIG. 5B is a top view of an example multi-color display panel 550 with a triangular array arrangement of the pixels. Both display panels 500, 550 include an array of micro lenses 510, 560, an array of pixel light sources 520, 570 and an optical spacer 540, 590 formed between the micro lens array and the pixel light source array, and each micro lens is aligned to a corresponding individual pixel light source.

In more detail, the display panel 500 with the square matrix arrangement includes an array of individual micro lenses 510, a corresponding array of pixel light sources 520 and an optical spacer 540 in between. Different from the single-color display panels 400, 450 shown in FIGS. 4A-4B, the pixel light source array in the display panel 500 include pixel light sources associated with different emission wavelengths, resulting in a multi-color display panel. For example, the pixel light source 520R produces red light and the corresponding micro lens 510R is aligned to the red pixel light source, the pixel light source 520G produces green light and the corresponding micro lens 510G is aligned to the green pixel light source, and the pixel light source 520B produces blue light and the corresponding micro lens 510B is aligned to the blue pixel light source. In one embodiment, several pixel light sources 520 with different colors are grouped together in a certain ratio to form an RGB full color pixel. For example, in a common design, red pixel light sources 520R, green pixel light sources 520G and blue pixel light sources 520B are grouped in a ratio of 1:2:1 to form a single full color pixel 530 with a 2 by 2 square arrangement of light sources.

In FIGS. 5A-5B, the individual micro lenses 510, 560 of the corresponding display panel 500, 550 are spherical micro lenses. In alternate embodiments, the micro lenses can have non-spherical shapes. The micro lenses can also be arranged in other matrix arrangements, such as a rectangular matrix arrangement or a hexagonal matrix arrangement.

The display panel 550 with the triangular matrix arrangement also includes an array of individual micro lenses 560, a corresponding array of pixel light sources 570 and an optical spacer 590 in between, and the pixel light sources 570 are also associated with different emission wavelengths to provide different light colors. For example, the pixel light source 570R emits red light and the corresponding micro lens 560R is aligned to the red pixel light source, the pixel light source 570G emits green light and the corresponding micro lens 560G is aligned to the green pixel light source, and the pixel light source 570B emits blue light and the corresponding micro lens 560B is aligned to the blue pixel light source. In this example, red pixel light sources 520R, green pixel light sources 520G and blue pixel light sources 520B are grouped in a ratio of 1:1:1 to form a single full color pixel 580 with a triangular arrangement of light sources.

FIGS. 6A-6B show a side view and top view, respectively, of a multi-color display panel integrated with a cylindrical micro lens array, according to one embodiment. More specifically, FIG. 6A is a cross-sectional side view of the display panel 600, and FIG. 6B is a top view of the display panel 600. The display panel 600 shown in FIGS. 6A-6B includes a lens-less display panel 605 with an array of individual pixels 602 and a corresponding array of pixel light sources 620 with red pixel light sources 620R, green pixel light sources 620G and blue pixel light sources 620B, an array of micro lenses 622, and an optical spacer 640 formed between the pixel light sources and the micro lenses.

As shown in FIGS. 6A-6B, a one to one correspondence between the micro lenses 622 and the pixel light sources 620 is not required. For example, a single cylindrical micro lens may be aligned to a row of pixel light sources of a display panel. In more detail, micro lens 622R is aligned to a row of pixel light sources 620R that emit red light, micro lens 622G is aligned to a row of pixel light sources 620G that emit green light, and micro lens 622B is aligned to a row of pixel light sources 620B that emit blue light. In alternative embodiments not shown, there can be a one to one correspondence between the micro lenses 622 and the pixel light sources 620. For example, the micro lenses can be cylindrical micro lenses, but with a separate micro lens for each pixel light source.

Different from the display panels shown in FIGS. 4A-5B, the micro lenses 622 shown in FIGS. 6A-6B are cylindrical micro lenses.

FIGS. 7-13 show examples of different fabrication methods to form a display panel integrated with a micro lens array, according to various embodiments.

Figure 7A:
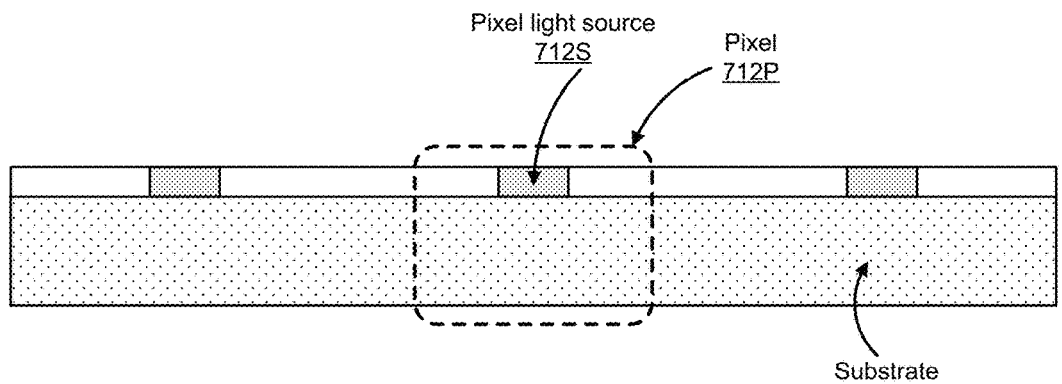
FIGS. 7A-7E, 8A-8B, 9A-9C, 10A-10B, and 11-13 show examples of fabrication methods to form a display panel integrated with a micro lens array, according to various embodiments.

FIGS. 7A-7E show a fabrication method to form a display panel integrated with a micro lens array using a high temperature reflow process, according to one embodiment. FIG. 7A is a cross-sectional view of a substrate 790 which already includes an integrated array of individual pixels 712P that each has a corresponding pixel light source 712S. In one embodiment, an array of pixel driver circuits (not shown) that control the corresponding pixel light source array is also integrated on the substrate 790. Each of the examples in FIGS. 7-13 will start from this structure, which will be referred to as the lens-less display panel.

Figure 7B:
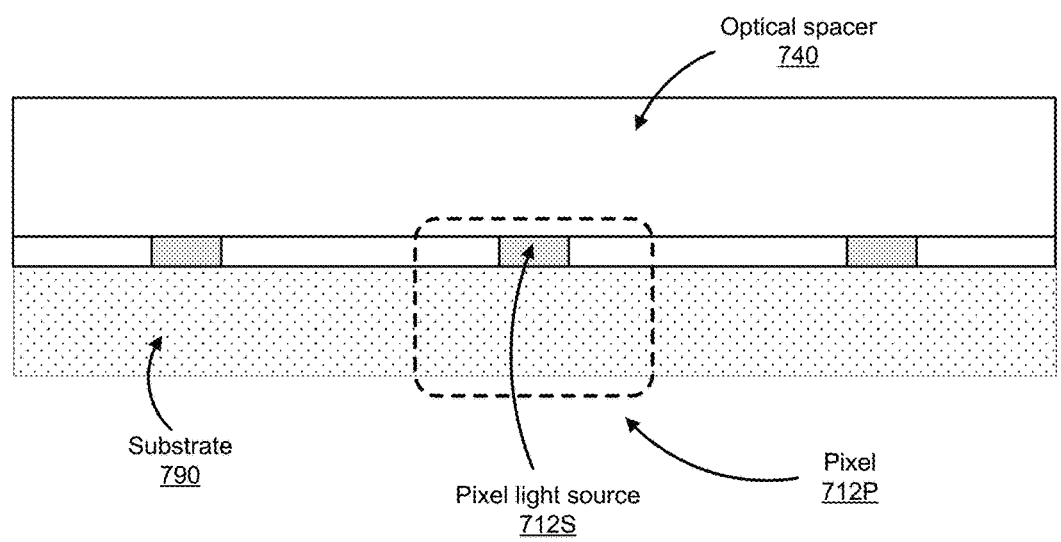
Figure 7C:
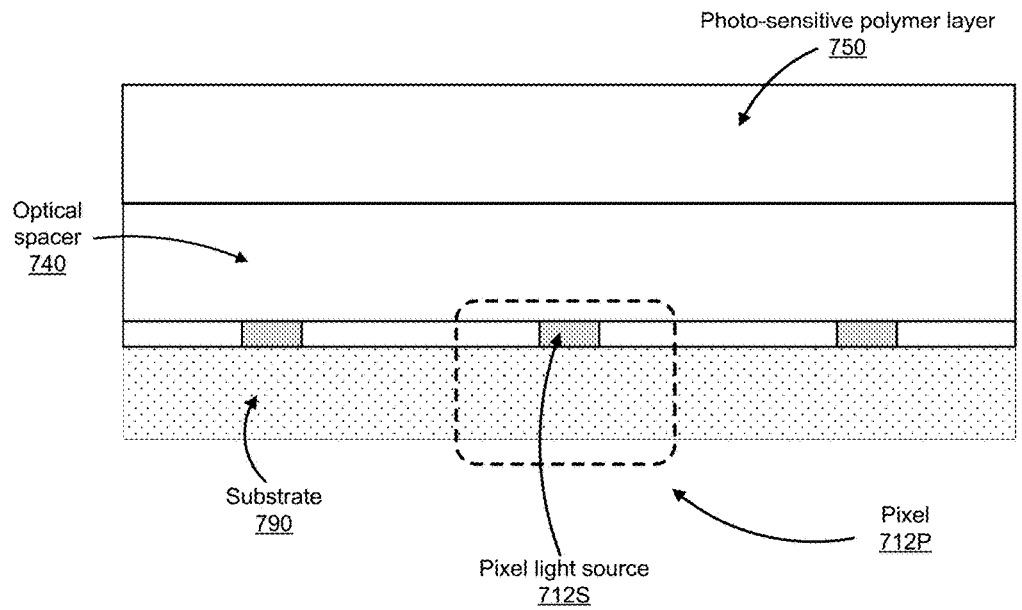
Figure 7D:
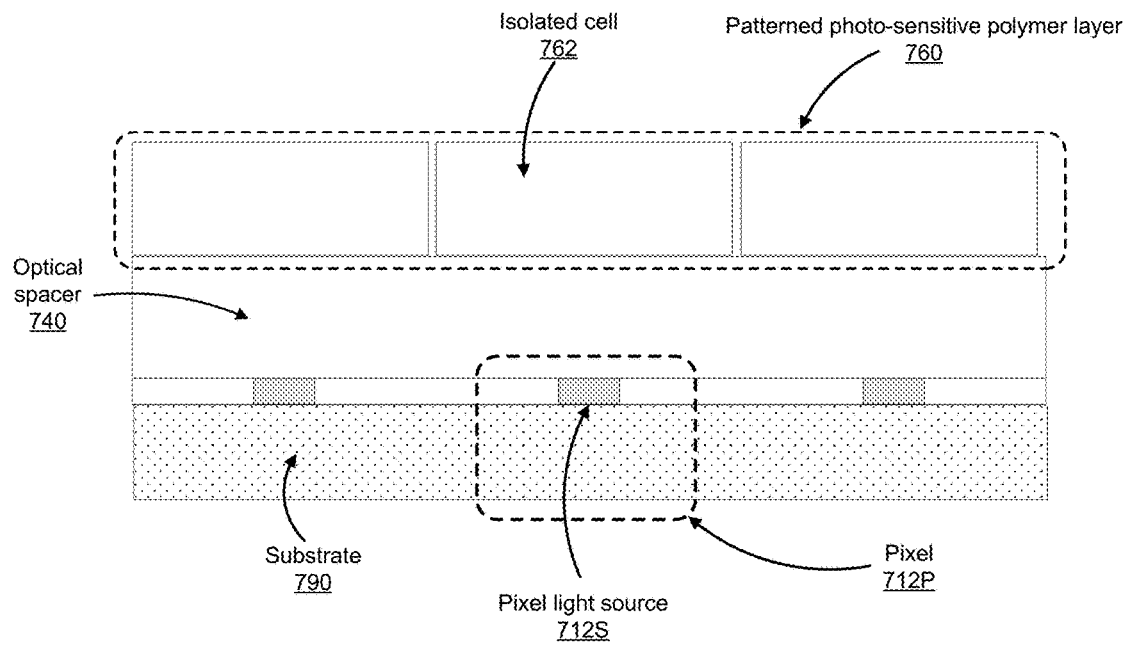

An optical spacer 740 is first fabricated on the substrate 790, as shown in FIG. 7B. The optical spacer 740 is fabricated above the pixel light sources 712S. After the optical spacer 740 is formed on the substrate 790, a photo-sensitive polymer layer 750 is deposited above the optical spacer 740, as shown in FIG. 7C. The photo-sensitive polymer layer 750 is patterned into isolated cells 762, as shown in FIG. 7D, to prepare for the formation of the micro lens array. As one example, the isolated cells are patterned and formed via a photo-lithography process.

Figure 7E:
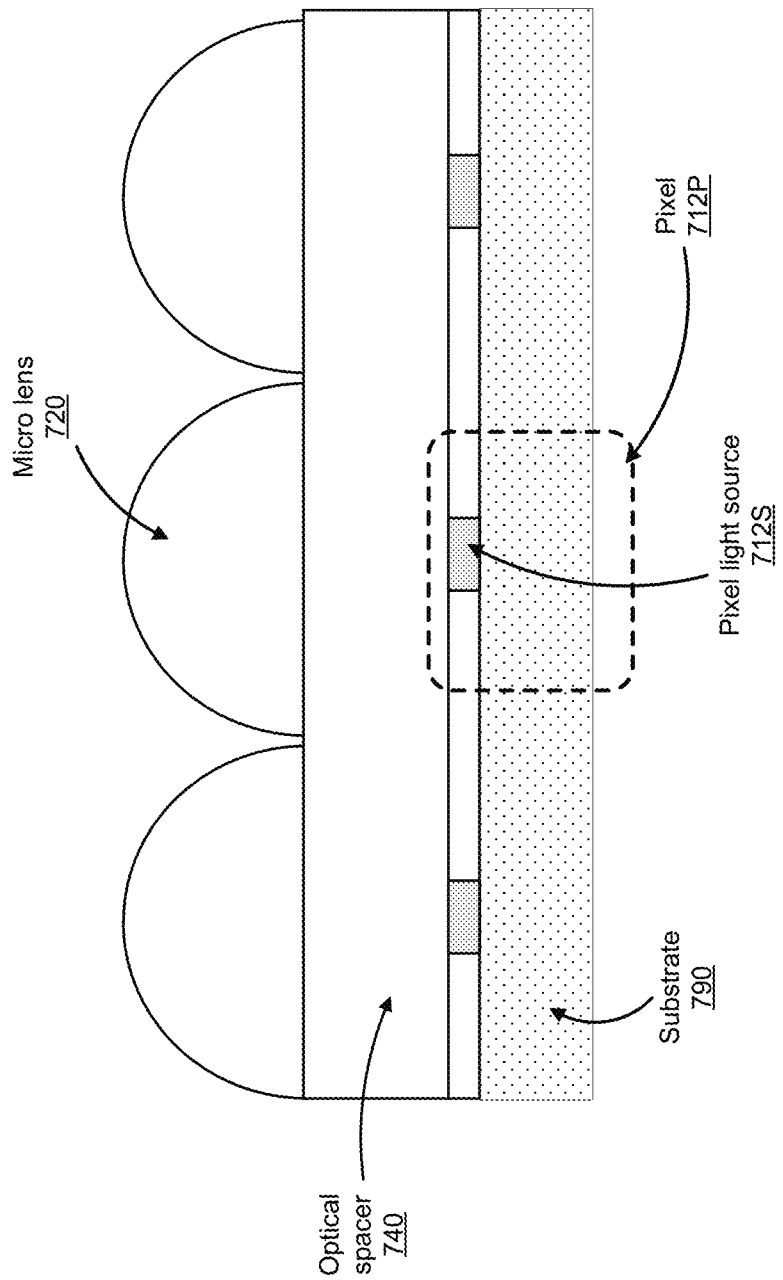

The patterned photo-sensitive polymer layer 760 with the isolated cells 762 is then shaped into micro lenses (e.g., spherical or cylindrical micro lenses) to form a micro lens array using high temperature reflow process. In one approach, the isolated cells 762 are formed into isolated micro lens via high temperature reflow. The patterned photo-sensitive polymer layer 760 is heated to a temperature above the melting point of the polymer material for a certain time. After the polymer material melts into a liquefied state, the surface tension of the liquefied material will render it into a shape with a smooth curvature surface. For a cell with a round base of a radius R when the height of the cell is 2R/3, a hemispherical micro lens will be formed after the reflow process. FIG. 7E shows a display panel integrated with the array of micro lenses 720 after the high temperature reflow process is finished. Note that, for convenience, the micro lenses 720 will be described as fabricated "on the substrate 790", even though they are not fabricated directly in contact with the substrate 790. Similarly, the optical spacer 740 is also formed "on the substrate 790."

Figure 8A:
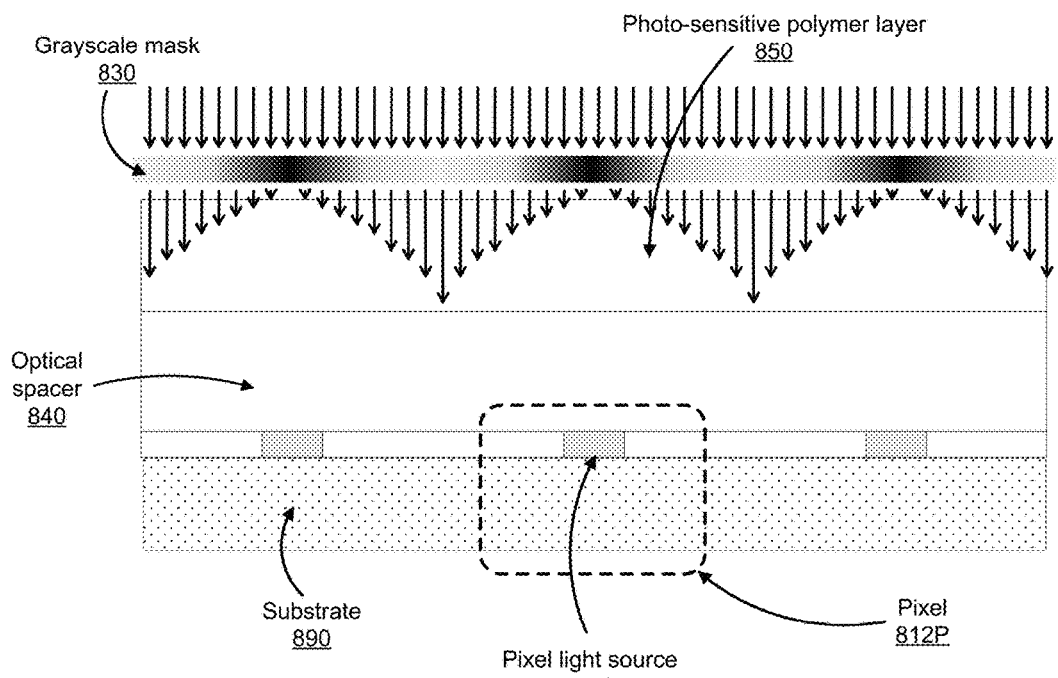
Figure 8B:
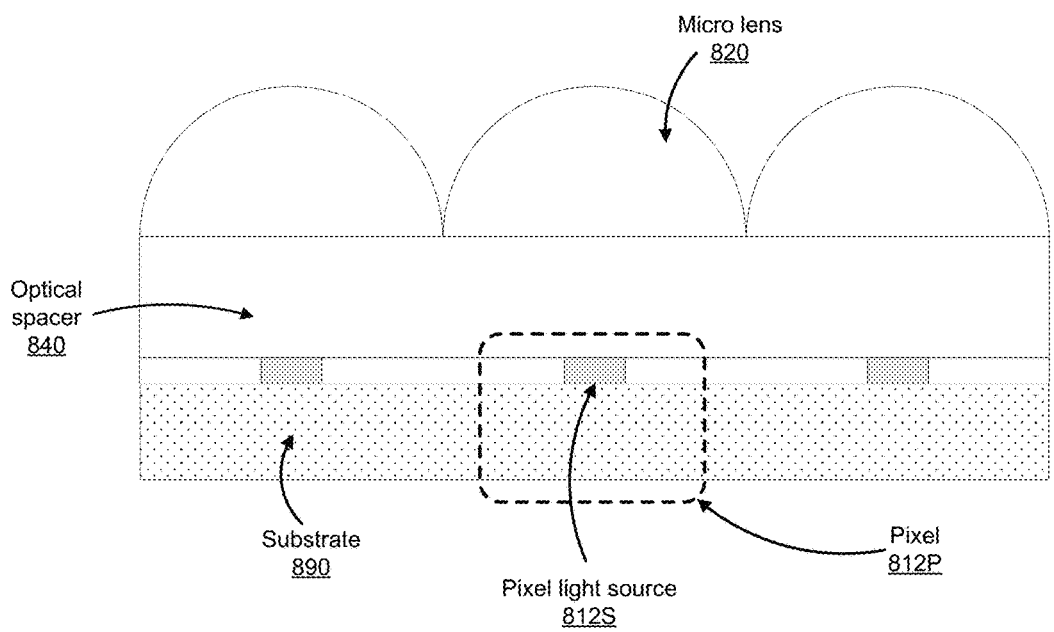

FIGS. 8A-8B show a fabrication method to form a display panel integrated with a micro lens array using grayscale mask photolithography exposure, according to one embodiment. In more detail, FIG. 8A is a cross-sectional view of the same device structure shown in FIG. 7C, except that all the reference numerals have been relabeled as 8xx instead of 7xx. In FIG. 8A, the photo-sensitive polymer layer 850 is exposed using a grayscale exposure pattern. In this example, a grayscale mask 830 that has a specific pattern for forming a micro lens shape is used to expose the photo-sensitive polymer layer 850. In FIG. 8A, the darker parts of the grayscale mask 830 block more of the light. The arrows below the grayscale mask 830 indicate how much exposure is achieved. The areas under the darker parts of the grayscale mask 830 are less exposed (shorter arrows) and the areas under the lighter parts of the grayscale mask 830 are more exposed. Developing the exposed photo-sensitive polymer layer 850 forms the array of micro lenses 820. FIG. 8B is a cross-sectional view of a display panel integrated with the array of micro lenses 820 after the grayscale mask photolithography exposure is finished.

Figure 9A:
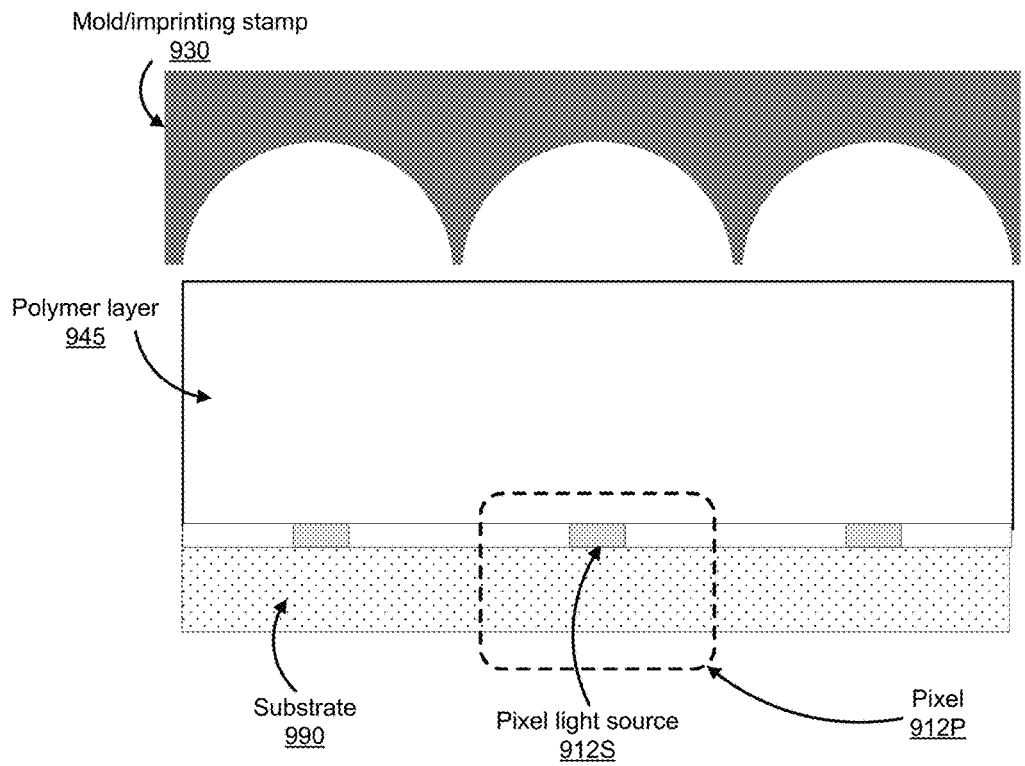
Figure 9B:
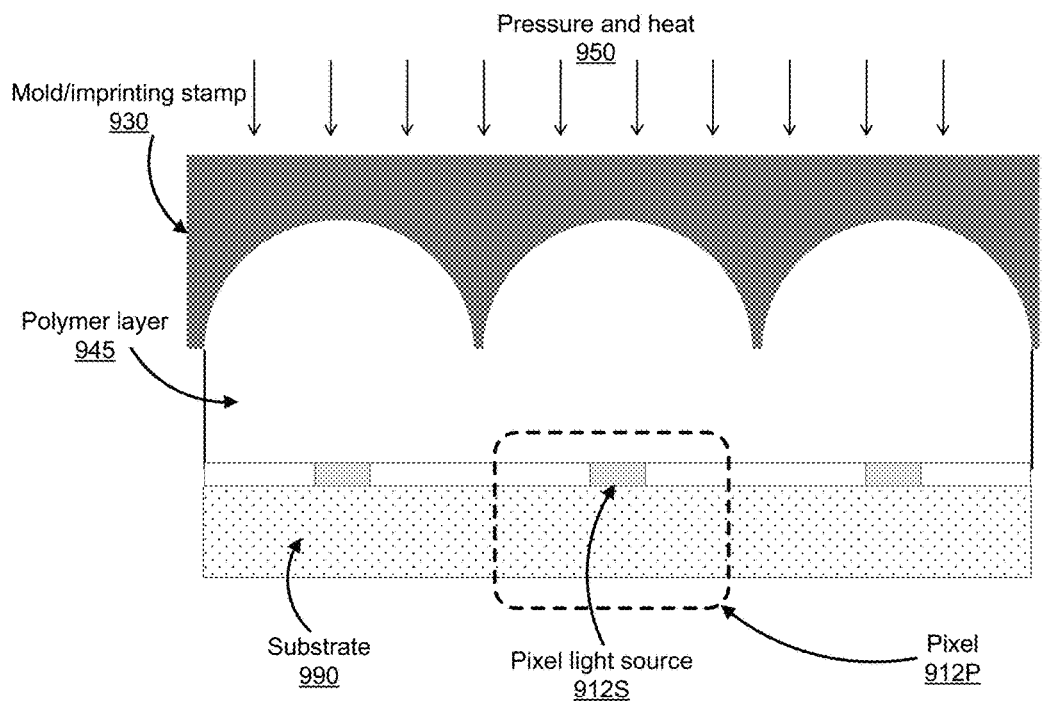
Figure 9C:
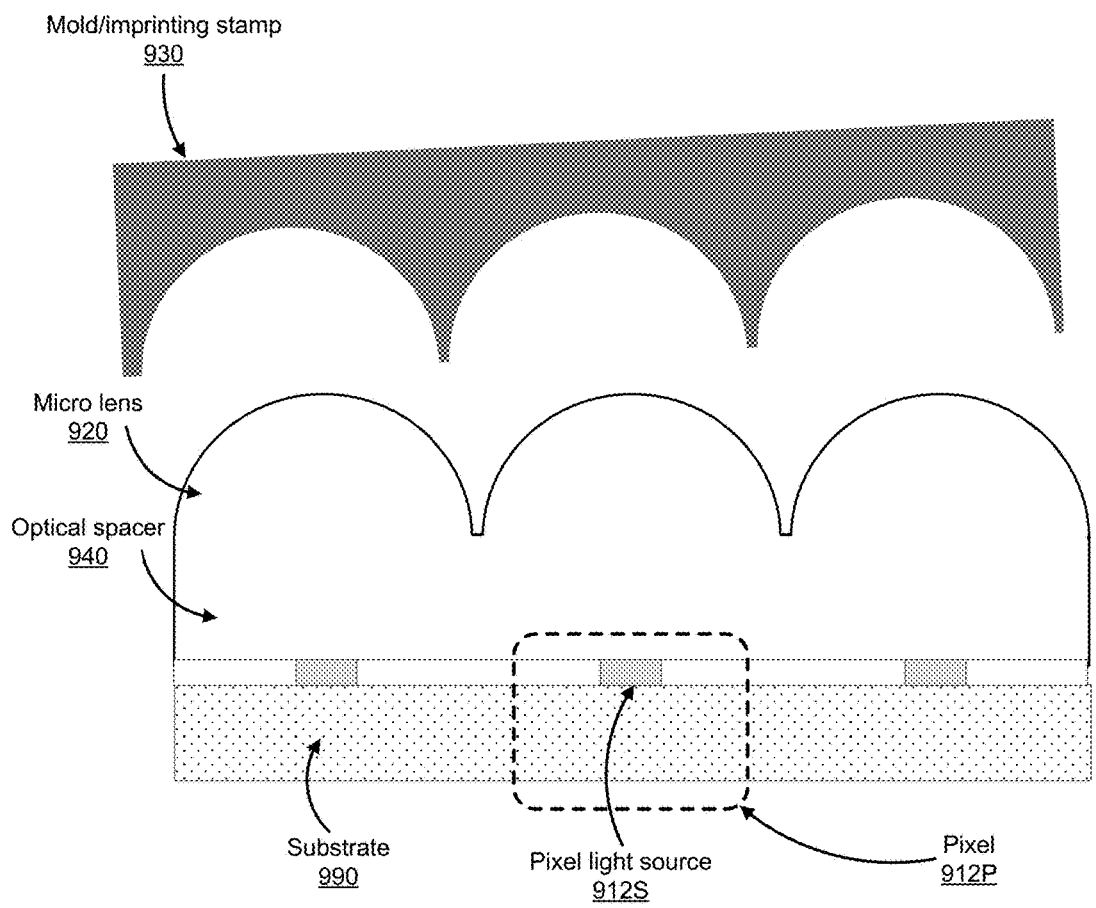

FIGS. 9A-9C show a fabrication method to form a display panel integrated with a micro lens array via a mold/imprinting process, according to one embodiment. In more detail, FIG. 9A shows a cross-sectional view of the same starting point as shown in FIG. 7A, but with a polymer layer 945 already deposited on the substrate 990. In this example, a mold or imprinting stamp 930 is used for forming an array of micro lenses, according to one embodiment. The mold/imprinting stamp 930 has a specific pattern for shaping a micro lens array. Pressure and heat 950 are applied to the mold/imprinting stamp 930 to insert the mold/imprinting stamp into the polymer layer 945 to a certain depth, as shown in FIG. 9B. After the mold/imprinting stamp 930 is removed, an array of micro lenses 920 and an optical spacer 940 between the micro lens array and the pixel light sources 912S are formed, as shown in FIG. 9C. Particularly, the array of micro lenses 920 and the optical spacer 940 are a single,integral component fabricated from the polymer layer 945 shown in FIGS. 9A-9B.

Figure 10A:
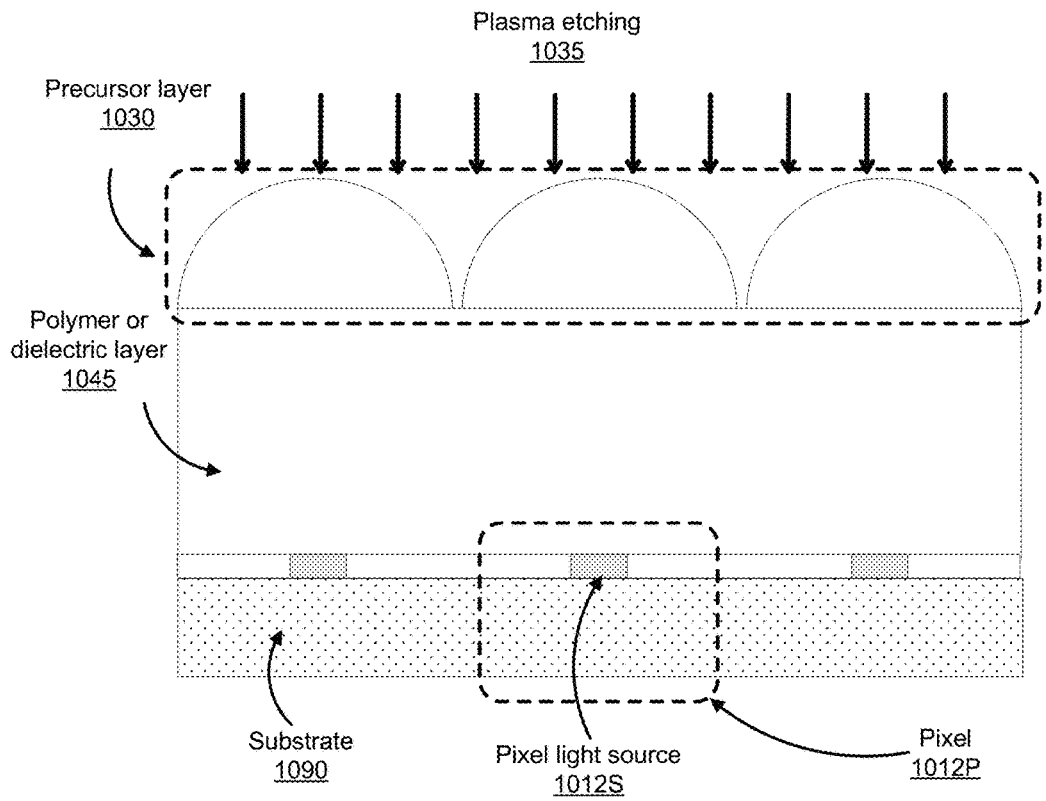
Figure 10B:
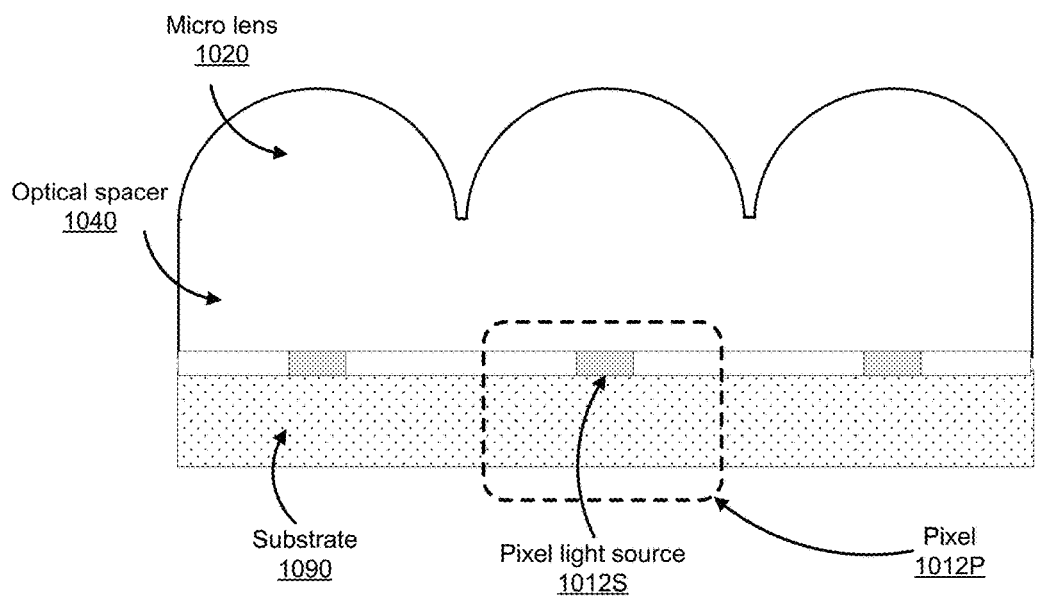

FIGS. 10A-10B show a fabrication method to form a display panel integrated with a micro lens array using dry etching pattern transfer, according to one embodiment. In more detail, FIG. 10A shows a cross-sectional view of the same starting point as shown in FIG. 7A, but with a polymer or dielectric layer 1045 already deposited on the substrate 1090. The structure in FIG. 10A also includes a precursor layer 1030, which has already been processed to produce a precursor for the microlens shape. The precursor layer 1030 can be shaped using different techniques, including the approaches described in the previous figures. FIG. 10A also shows that dry plasma etching 1035 is applied to the precursor 1030. This transfers the precursor shape to the underlying layer 1045. The result is an array of micro lenses 1020 and an optical spacer 1040, as shown in FIG. 10B.

Figure 11:
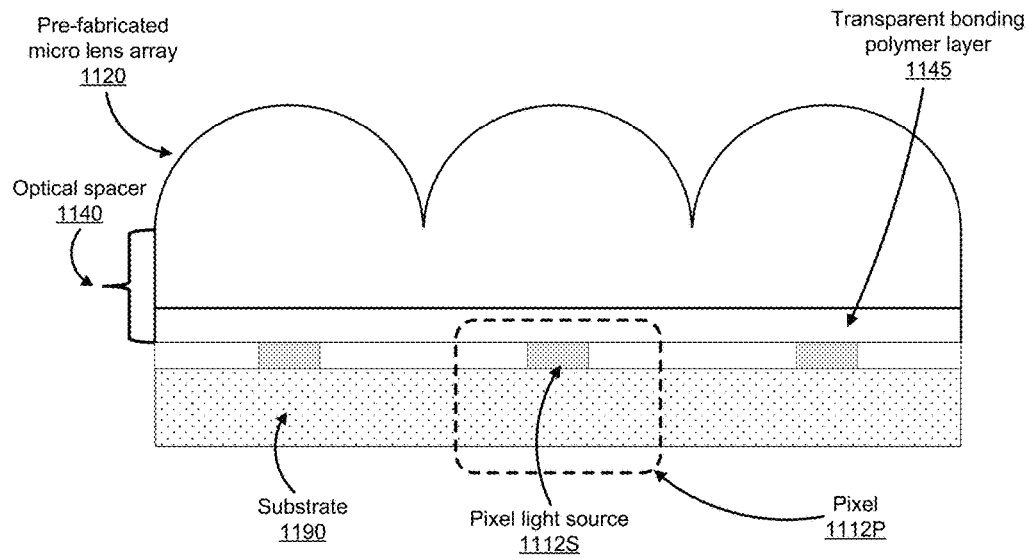
Figure 12:
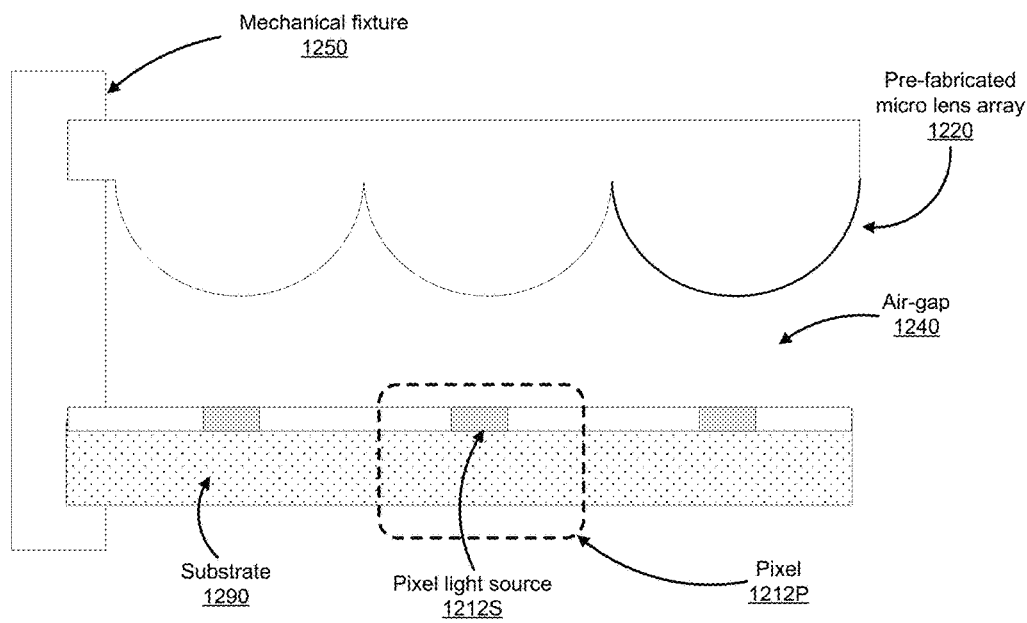

FIGS. 11-12 shows two fabrication methods to form a display panel integrated with a micro lens array using a pre-fabricated micro lens array, according to various embodiments. More specifically, FIG. 11 shows a fabrication method to bond a pre-fabricated micro lens array 1120 to the substrate 1190, according to one embodiment. In more detail, the pre-fabricated micro lens array 1120 is bonded to the substrate 1190 with a transparent bonding polymer layer 1145, and part of the pre-fabricated micro lens array and the transparent bonding polymer layer form the optical spacer 1140.

FIG. 12 shows a fabrication method to attach a micro lens array 1220 to the substrate 1290 using a mechanical fixture 1250, according to one embodiment. In more detail, in FIG. 12, both the micro lens array 1220 and the rest of the device are integrally attached to a mechanical fixture that positions the micro lenses 1220 relative to the pixel light sources 1212S, and an air-gap 1240 is formed between them. The micro lens array 1220 in FIG. 12 is also flipped with the curved side facing downward towards the pixel light sources 1212S. One purpose for flipping the micro lenses may be to reduce the distance between the micro lens array and the pixel light source array 1212S. In alternative embodiments not shown, the micro lens array 1220 may not be flipped, with the flat side facing towards the pixel light sources 1212S.

Figure 13:
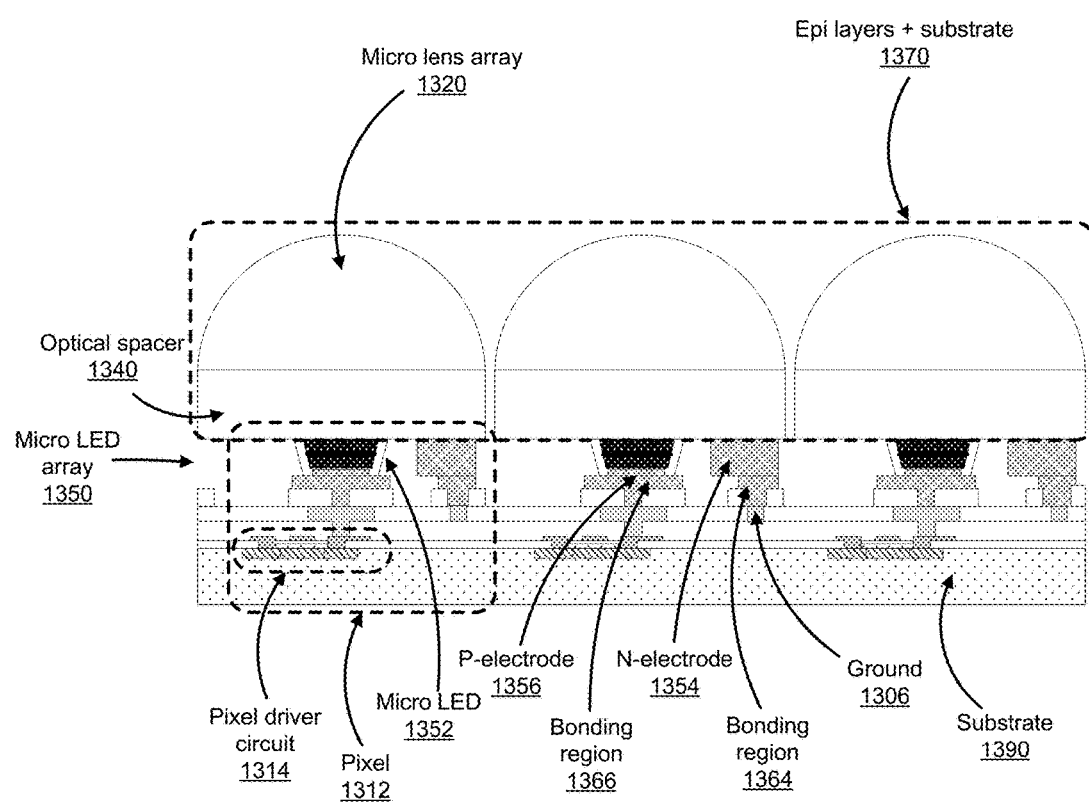

FIG. 13 is a cross-sectional view of an example display panel 1300 integrated with a micro lens array 1320 that is formed in a substrate of a micro LED array 1350 of the display panel, according to one embodiment. In FIG. 13, the display panel 1300 includes a pixel array that further includes multiple individual pixels 1312, a micro lens array 1320, and an optical spacer 1340 between the micro lens array and the pixel array.

In more detail, the individual pixels 1312 are integrated on a substrate 1390, and each individual pixel further includes a pixel driver circuit 1314 that controls a corresponding micro LED 1352, which is the pixel light source of the pixel. The pixel driver circuit 1314 can be, for example, a Field Effect Transistor (FET) driver circuit that further includes a source, gate and drain. As shown in FIG. 13, each micro LED 1352 further includes an N-electrode 1354 that is electrically connected to ground 1306 via a bonding region 1364, and a P-electrode 1356 that is electrically connected to a source/drain region of the pixel driver circuit 1314 via a bonding region 1366. In this example, the micro LEDs 1352 are first fabricated on a separate substrate that is also used to form the optical spacer 1340. The LEDs 1352 are then bonded to the substrate 1390 that includes the pixel driver circuits 1314. As one example, the bonding regions 1364, 1366 are formed by joining metal pads from both driver circuitry substrate and the LED substrate through a bonding process under high temperature and high pressure. The bonding metal can be selected from materials including Au, Sn, In, Ag, Pd. Further examples are described in U.S. patent application Ser. No. 15/135,217, "Semiconductor Devices with Integrated Thin-Film Transistor Circuitry," which is incorporated by reference in its entirety.

The LEDs 1352 are fabricated using epitaxial layers. The optical spacer 1340 and micro lens array 1320 are then fabricated into the epitaxial layers and/or the underlying substrate 1370 for the LEDs 1352 (which in this case is different from substrate 1390). In one embodiment, the micro lens array 1320 and the optical spacer 1340 may be formed from a single base material during the fabrication process. As one example, the micro lens array 1320 and the optical spacer 1340 may be first formed on the transparent semiconductor epi layers 1370 by using patterned substrate, and the micro LED array 1350 then formed afterwards. This assembly is then bonded to substrate 1390, which contains the pixel driver circuits 1314. Finally, the substrate is removed to form display panel 1300.

In an alternate approach, the substrate with the micro LED array 1350 is bonded to substrate 1390 before the optical spacer 1340 and/or micro lens array 1320 are formed. These are then formed after bonding. Other types of micro lenses can also be used with the approach of FIG. 13.

For the pre-fabricated micro lens arrays shown in FIGS. 11 and 12, they can be formed via various manufacturing methods, such as high temperature reflow process, grayscale mask photolithography exposure, dry etching pattern transfer process, or mold/imprinting process, as described above.

As described above, FIGS. 7-13 show various fabrication methods to form a display panel integrated with a micro lens array. It should be understood that these are merely examples, and other fabrication techniques can also be used. For example, the fabrication methods illustrated in FIGS. 7, 8, 9, 10 and 13 are examples where the micro lens array is fabricated on the substrate. The fabrication methods illustrated in FIGS. 11 and 12 are examples where the micro lens is fabricated separate from the substrate and then integrally attached to the substrate.

Although the detailed description contains many specifics, these should not be construed as limiting the scope of the invention but merely as illustrating different examples and aspects of the invention. It should be appreciated that the scope of the invention includes other embodiments not discussed in detail above. For example, micro lenses with different shape bases may also be used, such as square base or other polygon base. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

What is claimed is:

1. A method for fabricating a display panel with an integrated micro lens array, comprising:
    providing an array of pixel light sources and an array of pixel driver circuits integrated on a substrate, wherein the array of pixel driver circuits is electrically coupled to the array of pixel light sources; and
    fabricating an array of micro lenses on to the substrate, the array of micro lenses aligned to the pixel light sources and positioned to reduce a divergence of light produced by the pixel light sources, wherein fabricating the array of micro lenses on the substrate comprises:
        depositing a photo-sensitive polymer layer above the array of pixel light sources;
        patterning the photo-sensitive polymer layer into isolated cells; and
        applying a high temperature reflow process to the isolated cells to form the array of micro lenses.

2. The method of claim 1, wherein the array of pixel light sources is an array of LEDs.

3. The method of claim 1, wherein the display panel is a multi-color display panel, and the array of pixel light sources includes pixel light sources with different emission wavelengths.

4. The method of claim 1, wherein a brightness of the display panel in a direction perpendicular to a surface of the display panel, is at least three times greater with the array of micro lenses than without the array of micro lenses.

5. A method for fabricating a display panel with an integrated micro lens array, comprising:
    providing an array of pixel light sources and an array of pixel driver circuits integrated on a substrate, wherein the array of pixel driver circuits is electrically coupled to the array of pixel light sources; and
    fabricating an array of micro lenses on to the substrate, the array of micro lenses aligned to the pixel light sources and positioned to reduce a divergence of light produced by the pixel light sources, wherein fabricating the array of micro lenses on the substrate comprises:
        depositing a photo-sensitive polymer layer above the array of pixel light sources;
        photolithographically exposing the photo-sensitive polymer layer with a grayscale exposure pattern; and
        developing the exposed photo-sensitive polymer layer to form the array of micro lenses.

6. The method of claim 5, wherein the array of pixel light sources is an array of LEDs.

7. The method of claim 5, wherein the display panel is a multi-color display panel, and the array of pixel light sources includes pixel light sources with different emission wavelengths.

8. The method of claim 5, wherein a brightness of the display panel in a direction perpendicular to a surface of the display panel, is at least three times greater with the array of micro lenses than without the array of micro lenses.

9. A method for fabricating a display panel with an integrated micro lens array, comprising:

providing an array of pixel light sources and an array of pixel driver circuits integrated on a substrate, wherein the array of pixel driver circuits is electrically coupled to the array of pixel light sources; and fabricating an array of micro lenses on to the substrate, the array of micro lenses aligned to the pixel light sources and positioned to reduce a divergence of light produced by the pixel light sources, wherein fabricating the array of micro lenses on the substrate comprises:

depositing a polymer layer above the array of pixel light sources; and applying a mold of the array of micro lenses to the polymer layer to form the array of micro lenses.

10. The method of claim 9, wherein the array of pixel light sources is an array of LEDs.

11. The method of claim 9, wherein the display panel is a multi-color display panel, and the array of pixel light sources includes pixel light sources with different emission wavelengths.

12. The method of claim 9, wherein a brightness of the display panel in a direction perpendicular to a surface of the display panel, is at least three times greater with the array of micro lenses than without the array of micro lenses.

13. A method for fabricating a display panel with an integrated micro lens array, comprising:

providing an array of pixel light sources and an array of pixel driver circuits integrated on a substrate, wherein the array of pixel driver circuits is electrically coupled to the array of pixel light sources; and fabricating an array of micro lenses on to the substrate, the array of micro lenses aligned to the pixel light sources and positioned to reduce a divergence of light produced by the pixel light sources, wherein fabricating the array of micro lenses on the substrate comprises:

depositing a polymer layer above the array of pixel light sources;

depositing a precursor layer above the polymer layer;

processing the precursor layer to form a precursor for the micro lens array shape; and dry etching the precursor and polymer layers, to transfer the micro lens array shape from the precursor layer to the polymer layer.

14. The method of claim 13, wherein the array of pixel light sources is an array of LEDs.

15. The method of claim 13, wherein the display panel is a multi-color display panel, and the array of pixel light sources includes pixel light sources with different emission wavelengths.

16. The method of claim 13, wherein a brightness of the display panel in a direction perpendicular to a surface of the display panel, is at least three times greater with the array of micro lenses than without the array of micro lenses.

17. A method for fabricating a display panel with an integrated micro lens array, comprising:

providing an array of pixel light sources and an array of pixel driver circuits integrated on a substrate, wherein the array of pixel driver circuits is electrically coupled to the array of pixel light sources; and fabricating an array of micro lenses on to the substrate, the array of micro lenses aligned to the pixel light sources and positioned to reduce a divergence of light produced by the pixel light sources, wherein the array of pixel light sources are fabricated using epitaxial layers, and the array of micro lenses are fabricated into the epitaxial layers.

18. The method of claim 17, wherein the array of pixel light sources is an array of LEDs.

19. The method of claim 17, wherein the display panel is a multi-color display panel, and the array of pixel light sources includes pixel light sources with different emission wavelengths.

20. The method of claim 17, wherein a brightness of the display panel in a direction perpendicular to a surface of the display panel, is at least three times greater with the array of micro lenses than without the array of micro lenses.

* * * * *